(12) United States Patent
Muza et al.

(10) Patent No.: US 9,124,220 B2
(45) Date of Patent: Sep. 1, 2015

(54) DIFFERENTIAL MICROPHONE WITH DUAL POLARITY BIAS

(71) Applicant: Robert Bosch GmbH, Stuttgart (DE)

(72) Inventors: John Matthew Muza, Venetia, PA (US); Philip Sean Stetson, Wexford, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/038,097

(22) Filed: Sep. 26, 2013

(65) Prior Publication Data

US 2014/0270250 A1    Sep. 18, 2014

Related U.S. Application Data

(60) Provisional application No. 61/782,307, filed on Mar. 14, 2013.

(51) Int. Cl.
| | |
|---|---|
| H04R 3/00 | (2006.01) |
| H03F 3/187 | (2006.01) |
| H04R 1/40 | (2006.01) |
| H04R 19/00 | (2006.01) |
| H03F 3/45 | (2006.01) |

(52) U.S. Cl.
CPC ............ *H03F 3/187* (2013.01); *H03F 3/45928* (2013.01); *H04R 1/406* (2013.01); *H04R 3/005* (2013.01); *H04R 19/005* (2013.01); *H04R 2201/003* (2013.01)

(58) Field of Classification Search
CPC ......... H04R 19/04; H04R 19/005; H04R 1/04
See application file for complete search history.

(56) References Cited

U.S. PATENT DOCUMENTS

| | | | | |
|---|---|---|---|---|
| 3,581,012 | A | * 5/1971 | Kishi et al. | 381/91 |
| 4,433,580 | A | * 2/1984 | Tward | 73/718 |
| 5,473,684 | A | * 12/1995 | Bartlett et al. | 379/395 |
| 5,546,458 | A | 8/1996 | Iwami | |
| 7,130,431 | B2 | 10/2006 | Watson et al. | |

(Continued)

FOREIGN PATENT DOCUMENTS

| | | |
|---|---|---|
| EP | 1959711 | 8/2008 |
| WO | 2010/135280 | 11/2010 |
| WO | 2012/119637 | 9/2012 |

OTHER PUBLICATIONS

"Types of Interference." audio-technica. Jan. 1, 2008. Web.*

(Continued)

*Primary Examiner* — Joseph Saunders, Jr.
*Assistant Examiner* — James Mooney
(74) *Attorney, Agent, or Firm* — Michael Best & Friedrich LLP

(57) ABSTRACT

Methods and system are described for cancelling interference in a microphone system. A positive bias voltage is applied to a first microphone diaphragm and a negative bias voltage is applied to a second microphone diaphragm. The diaphragms are configured to exhibit substantially the same mechanical deflection in response to acoustic pressures received by the microphone system. A differential output signal is produced by combining a positively-biased output signal from the first microphone diaphragm and a negatively-biased output signal from the second microphone diaphragm. This combining cancels common-mode interferences that are exhibited in both the positively-biased output signal and the negatively-biased output signal.

16 Claims, 4 Drawing Sheets

(56) References Cited

U.S. PATENT DOCUMENTS

| | | |
|---|---|---|
| 8,023,667 B2 | 9/2011 | Lin |
| 2008/0192962 A1* | 8/2008 | Halteren ........................ 381/170 |
| 2010/0177913 A1* | 7/2010 | Chiu et al. .................... 381/111 |
| 2010/0280825 A1 | 11/2010 | Takano et al. |
| 2012/0093340 A1 | 4/2012 | Shimura |

OTHER PUBLICATIONS

International Search Report and Written Opinion for Application No. PCT/US2014/025621 dated Sep. 22, 2014 (18 pages).

Neumann J J et al: "A fully-integrated cmos-mems audio microphone", Transducers, Solid-State Sensors, Actuators and Microsystems, 12th Inn Ational Conference on, 2003, Piscataway, NJ, USA, IEEE, vol. 1, Jun. 9, 2003, pp. 230-233.

David T Martin et al: "A Micromachined Dual-Backplate Capacitive Microphone for Aeroacoustic Measurements", Journal of Microelectromechanical Systems, IEEE Service Center, US, vol. 16, No. 6, Dec. 1, 2007, pp. 1289-1382.

* cited by examiner

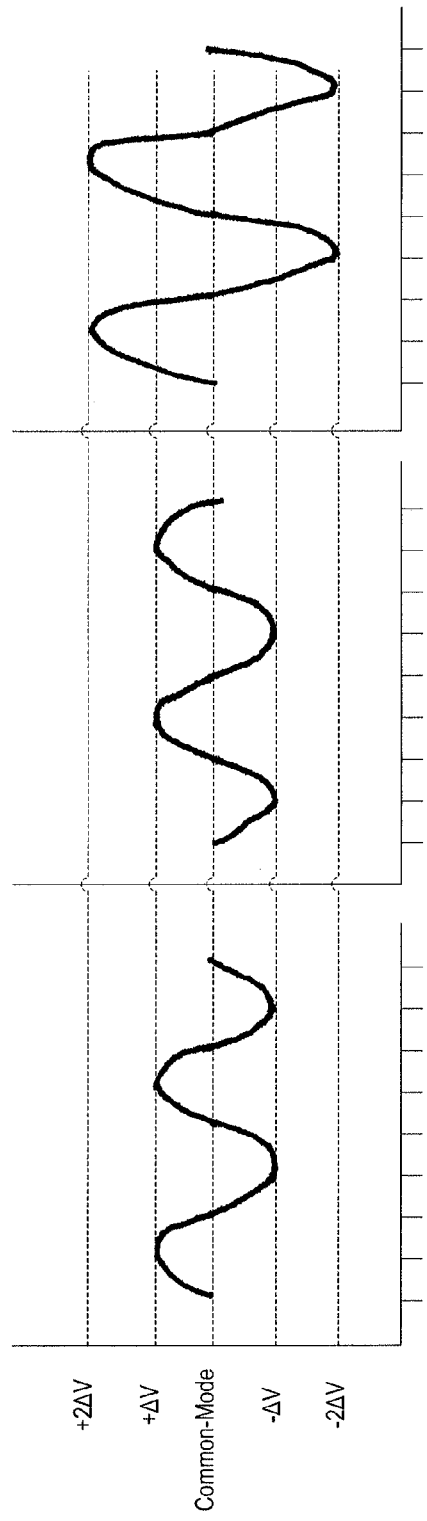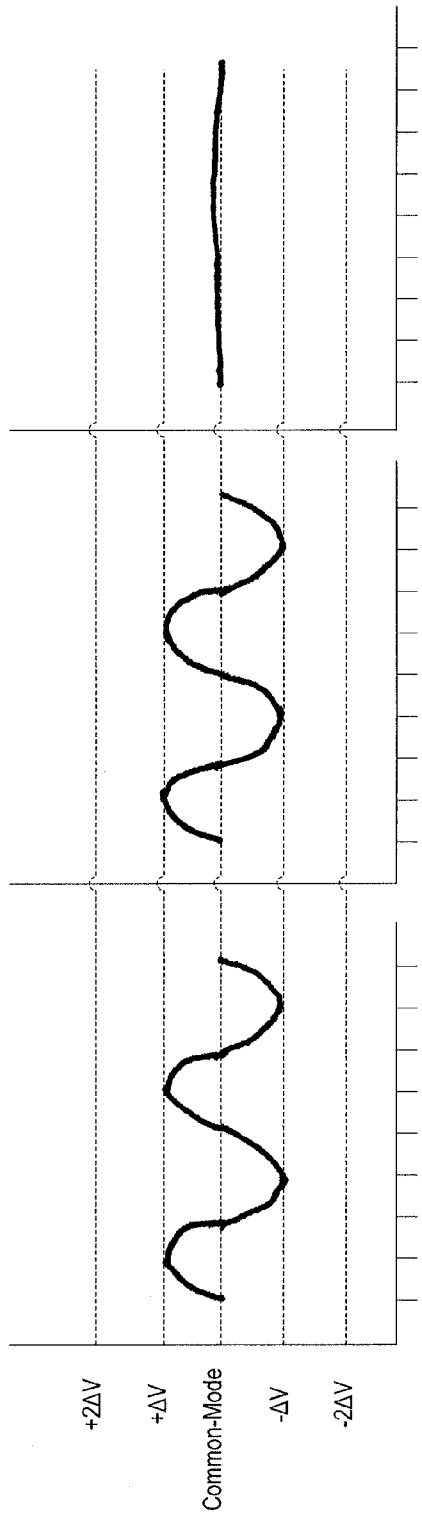

DIFFERENTIAL MICROPHONE WITH DUAL POLARITY BIAS

RELATED APPLICATIONS

This application claims the benefit of U.S. Provisional Application No. 61/782,307, filed on Mar. 14, 2013 and entitled "DIFFERENTIAL MEMS MICROPHONE USING DUAL POLARITY BIAS," the entire contents of which are incorporated herein by reference.

BACKGROUND

The present invention relates to differential microphone systems. Differential microphones typically include two membranes. The signals detected by the two membranes are then processed to provide a desired output. For example, the two diaphragms can be arranged facing different directions and the differential signal used to cancel ambient noise (i.e., noise cancellation differential microphones). In some systems, the differential signal can also be used to determine the directionality of sound (i.e., from what direction did the sound originate).

SUMMARY

In one embodiment, the invention provides a differential microphone system including a first microphone diaphragm and a second microphone diaphragm. The first and second microphone diaphragms are positioned to receive acoustic pressure from the same direction at substantially the same amplitude. As such, the deflection of the first and second diaphragms caused by acoustic pressures applied to the microphone are substantially the same. A positive bias voltage is applied to the first diaphragm while a negative bias voltage is applied to the second diaphragm. A differential amplifier is configured to receive the positively-biased output signal from the first microphone diaphragm and the negatively-biased output signal from the second microphone diaphragm and to produce a differential output signal.

In some embodiments, the opposite biasing voltages applied to the first and second diaphragms causes the same diaphragm deflections to produce output signals that have the same magnitude but opposite polarity. In some embodiments, the microphone system is configured such that non-acoustic interference (for example, light interference) affects the positively-biased output signal and the negatively-biased output signal in the same way—the positively-biased and negatively-biased signals are both offset by the same magnitude and the same polarity. As such, when the positively-biased signal and the negatively-biased signal are combined to produce the differential signal, common-mode interference is cancelled and the differential signal more accurately represents the acoustic pressures applied to the first and second diaphragms of the microphone system.

In another embodiment, the invention provides a method of cancelling interference in a microphone system. A positive bias voltage is applied to a first microphone diaphragm and a negative bias voltage is applied to a second microphone diaphragm. The diaphragms are configured to exhibit substantially the same mechanical deflection in response to acoustic pressures received by the microphone system. A differential output signal is produced by combining a positively-biased output signal from the first microphone diaphragm and a negatively-biased output signal from the second microphone diaphragm. This combining cancels common-mode interferences that are exhibited in both the positively-biased output signal and the negatively-biased output signal.

In still another embodiment, the invention provides a microphone system that includes a first microphone diaphragm, a second microphone diaphragm and a differential amplifier. The two microphone diaphragms are arranged to receive acoustic pressures from the same direction at the same amplitude. However, a positive bias voltage is applied to the first diaphragm while a negative bias voltage is applied to the second diaphragm. The differential amplifier receives a positively-biased output signal from the first microphone diaphragm and a negatively-biased output signal from the second microphone diaphragm and produces a differential output signal by combining the positively-biased output signal and the negatively-biased output signal. The microphone system is configured such that acoustic pressure received from the first direction causes mechanical deflections of the first diaphragm and substantially identical mechanical deflections of the second diaphragm. Mechanical deflections of the first diaphragm produce the positively-biased output signal while mechanical deflections of the second diaphragm produce the negatively-biased output signal. The positively-biased output signal and the negatively-biased output signal caused by the mechanical deflections of the first and second diaphragms have substantially the same magnitude but opposite polarities. When, non-acoustic interference alters the positively-biased output signal and the negatively biased output signal, both the positively-biased output signal and the negatively-biased output signal are altered by substantially the same magnitude and polarity. Therefore, combining the positively-biased output signal and the negatively-biased output signal cancels the non-acoustic interference from the differential output signal.

Other aspects of the invention will become apparent by consideration of the detailed description and accompanying drawings.

BRIEF DESCRIPTION OF THE DRAWINGS

FIGS. 3A, 3B, and 3C are graphs of a positively-biased output signal, a negatively-biased output signal, and a differential output signal produced by the microphone system of FIG. 1A in response to acoustic pressures on the diaphragms.

FIGS. 4A, 4B, and 4C are graphs of a positively-biased output signal, a negatively-biased output signal, and a differential output signal produced by the microphone system of FIG. 1B in response to non-acoustic interference.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways.

Figure 1B:
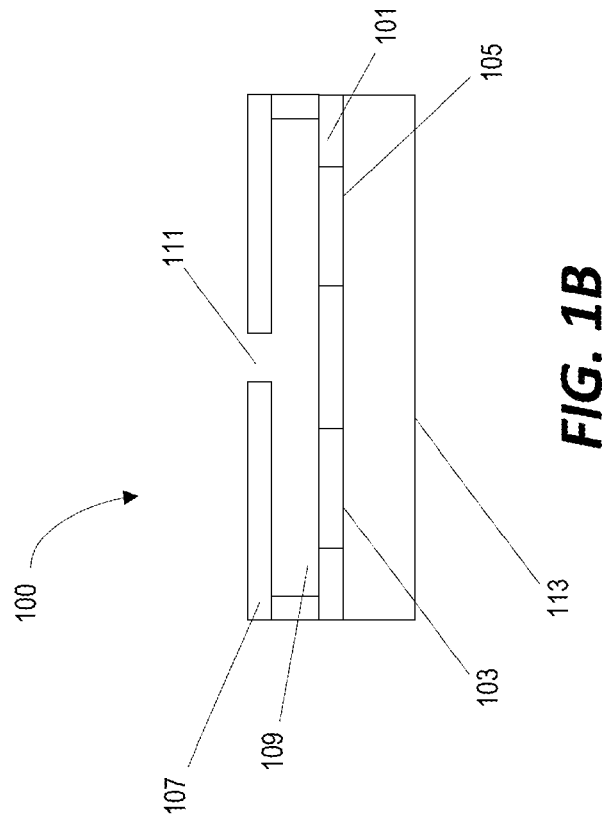
FIG. 1B is a cross-section side view of the differential microphone system of FIG. 1A.
Figure 1A:
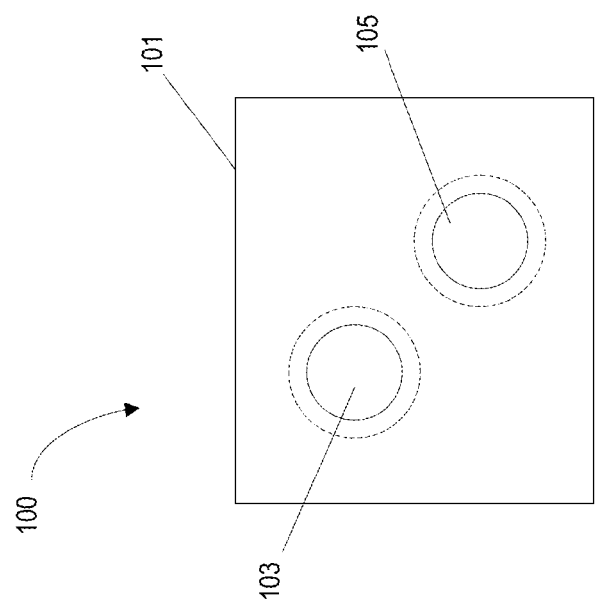
FIG. 1A is an overhead-cutaway view of a differential microphone system according to one embodiment.

FIG. 1A illustrates a differential microphone system 100 that includes a CMOS-MEMS device layer 101. A CMOS- MEMS device layer 101 is constructed primarily of silicon or other materials and includes both CMOS circuitry elements and one or more microelectromechanical structures (MEMS devices) formed directly within the CMOS-MEMS device layer 101. The CMOS-MEMS device layer 101 of FIG. 1A includes first MEMS microphone diaphragm 103 and a second MEMS microphone diaphragm 105. The two diaphragms 103, 105 are formed on the same package according to the same process. Therefore, acoustic pressures (i.e., sound) directed toward the top surface of the CMOS-MEMS device layer 101 cause substantially the same motion and deflection of the first membrane 103 and the second membrane 105.

FIG. 1B illustrates the same differential microphone system 100 from a cross-sectional perspective. A lid 107 is positioned above the CMOS-MEMS layer 101 to form an acoustic channel 109. An opening (or acoustic port) 111 in the lid 107 allows acoustic pressures (sounds) to enter the acoustic channel 109 and cause mechanical deflection of the two diaphragms 103, 105. As shown in FIG. 1B, the diaphragms 103, 105 are arranged equidistant from the acoustic port 111. Therefore, deflections of the diaphragms 103, 105 caused by acoustic pressures entering through the acoustic port 111 are substantially the same in both diaphragms. Below the CMOS-MEMS layer 101 is a back-volume component 113 that allows the diaphragms 103, 105 to move back and forth (or up and down) in response to the acoustic pressures.

Although the examples described herein refer to a CMOS-MEMS chip 101, other constructions may include a MEMS device chip and a separate CMOS chip. In such constructions, the two diaphragms 103, 105 may be formed on the same chip (i.e., the MEMS chip). However, in still other constructions, the microphone system package can include two separate MEMS chips—one for each diaphragm—as long as the MEMS chips are arranged and manufactured such that acoustic pressures cause substantially the same deflection on both diaphragms. Furthermore, in other constructions, the position of the diaphragms relative to the opening 111 may be different than as illustrated in FIG. 1B. For example, the diaphragms can be sized and arranged so that they are both positioned directly below the opening 111.

Figure 2:
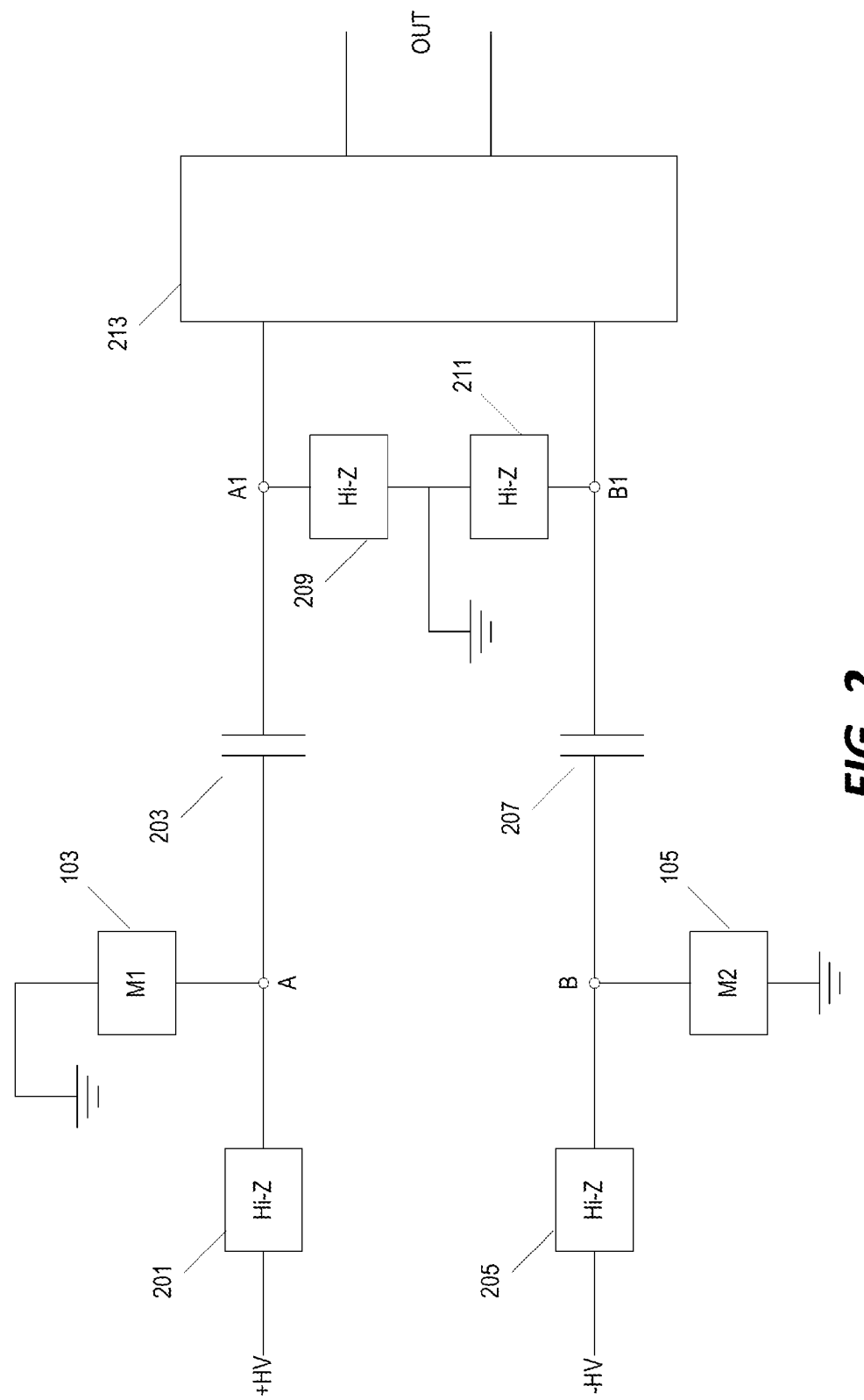
FIG. 2 is a schematic diagram of a differential biasing circuit for use with the microphone system of FIG. 1A.
Figure 5:
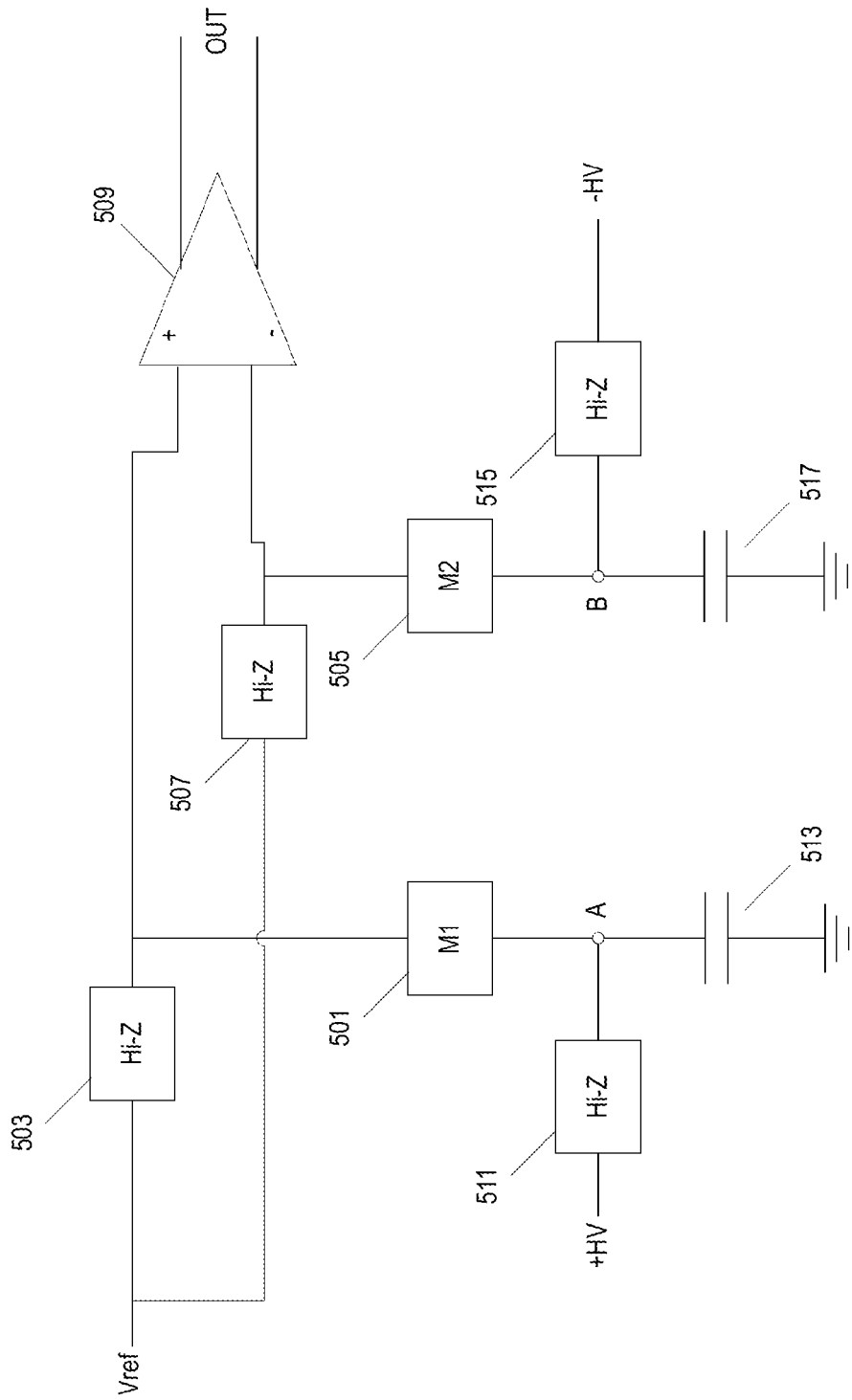
FIG. 5 is a schematic diagram of another differential biasing circuit for use with the microphone system of FIG. 1A.

FIG. 2 illustrates an example of a biasing circuit that uses an inverted transduction response to derive a differential audio signal from a dual-membrane microphone system such as illustrated in FIGS. 1A and 1B. A positive bias voltage (+HV) is applied to a first terminal (node A) of the first microphone diaphragm 103. The other terminal of the microphone diaphragm 103 is coupled to ground. The first microphone diaphragm 103 acts as a capacitor. As such, deflections of the diaphragm 103 caused by acoustic pressures change the capacitance between node A and ground.

A high-impedance device 201 is coupled between the positive bias voltage source and the first terminal of the microphone diaphragm 103 (i.e., node A). As used herein, a high-impedance device can include one or more electronic components designed to increase impedance between a voltage source and a mechanical or electronic component (i.e., the MEMS diaphragm 103). Another capacitor 203 is positioned between the first terminal of the diaphragm 103 and an output node A1 of the biasing circuit for the first diaphragm 103.

Similarly, a negative bias voltage (−HV) is applied to the first terminal (node B) of the second diaphragm 105 while the second terminal of the diaphragm 105 is coupled to ground. A high-impedance device 205 is coupled between the source of negative bias voltage and the diaphragm 105 (i.e. node B). Another capacitor 207 is coupled between node B and an output node B1 of the biasing circuit for the second diaphragm 105. The output nodes A1, B1 of both biasing circuits are coupled to ground each through another high impedance device (209 and 211, respectively). The output node A1 of the positively-biased diaphragm 103 is coupled to the positive terminal of a differential amplifier 213. The output node B1 of the negatively-biased diaphragm is coupled to the negative terminal of the differential amplifier 213. As such, two oppositely-biased output signals are combined by the differential amplifier 213 to produce a differential output signal that represents the difference between the positively-biased signal and the negatively-biased signal at any given time.

As illustrated in FIG. 3A, mechanical deflections of the first diaphragm 103 caused by acoustic pressures produce a positively-biased output signal (i.e., a voltage) at the output node A1. Due to the proportional relationship Q=C*V, voltage decreases as capacitance increases (e.g., due to movements/deflections of the diaphragm). The same mechanical deflections on the second diaphragm 103 produce a negatively-biased output signal (i.e., a voltage) at the output node B1 as illustrated in FIG. 3B. Although the mechanical deflections of both diaphragms are substantially identical, the opposite biasing voltages cause the output signals to have the same magnitude, but opposite polarities. The differential amplifier 213 combines the positively-biased output signal and the negatively-biased output signal to produce a differential output signal as shown in FIG. 3C. Because of the opposite biases applied to the two diaphragms, deflections that cause the positively-biased output signal to "decrease" also cause the negatively-biased output signal to "increase" resulting in less potential difference in the combined differential signal. As such, the differential output signal is effectively an amplified version of both the positively-biased output signal and the negatively-biased output signal (which, themselves, are opposing representations of the same acoustic signal).

However, the output signal of a microphone can be affected by environmental factors other than acoustic pressures. For example, light contacting the microphone diaphragm can affect the output signal (i.e., the voltage). This interference can adversely affect the performance of a microphone and degrade the quality of the reproduced sound. The dual-polarity differential microphone system described above can reduce or eliminate the negative effect of such interference by cancelling common-mode interference that is exhibited on both the positively-biased output signal and the negatively-biased output signal.

FIG. 4A illustrates the positively-biased output signal due only to non-acoustic interference (e.g., light interference without any acoustic pressure exerted on the diaphragm). FIG. 4B illustrates the effect of the same non-acoustic interference on the negatively-biased output signal. Although, as discussed above, the opposing bias voltages cause the same mechanical deflections to produce opposite output signals, non-acoustic interference affects both output signals the same way despite the opposite biasing voltages. As such, the magnitude and polarity of the positively-biased output signal due to non-acoustic interference is identical to the magnitude and polarity of the negatively-biased output signal. When the two signals are combined by the differential amplifier, the common-mode interference is effectively cancelled (as illustrated in FIG. 4C) and the differential output signal more accurately represents the acoustic pressures that cause deflections of the microphone diaphragms.

FIG. 3 illustrates an alternative construction of a differential biasing circuit that can be used to cancel common-mode interference. In this example, the positively-biased diaphragm is coupled a reference voltage $V_{ref}$ through a high-impedance device 503 and coupled to the positive terminal of a differential amplifier 509. A negatively-biased diaphragm 505 is similarly coupled to the reference voltage $V_{ref}$ through another high-impedance device 507 and coupled to the negative terminal of the differential amplifier 509.

A positive bias voltage (+HV) is applied to the opposite terminal (node A) of the first diaphragm 501 through yet another high-impedance device 511. The diaphragm 501 is also coupled to ground at node A through a capacitor 513. A negative bias voltage (−HV) is applied to the opposite terminal (node B) of the second diaphragm 505 through another high-impedance device 515. The negatively-biased diaphragm 505 is also coupled to ground at node B through a second capacitor 517.

Thus, the invention provides, among other things, a dual-polarity differential microphone system capable of cancelling common-mode interference caused by non-acoustic sources. Various features and advantages of the invention are set forth in the following claims.

What is claimed is:

1. A microphone system including:
    a first microphone diaphragm positioned to receive acoustic pressure from a first direction through a fixed acoustic port, wherein a positive bias voltage is applied to the first diaphragm;
    a second microphone diaphragm coplanar with the first microphone diaphragm and positioned to receive acoustic pressure from the first direction through the fixed acoustic port at substantially the same amplitude as the acoustic pressure received by the first microphone diaphragm, wherein a negative bias voltage is applied to the second diaphragm;
    a shared back-volume adjacent both the first microphone diaphragm and the second microphone diaphragm opposite the fixed acoustic port; and
    a differential amplifier configured to
        receive a positively-biased output from the first microphone diaphragm and a negatively-biased output from the second microphone diaphragm, and
        produce a differential signal based on the positively-biased output and the negatively-biased output.

2. The microphone system of claim 1, wherein the differential amplifier is configured to cancel common-mode interference from the differential signal that is exhibited in both the positively-biased output and the negatively-biased output.

3. The microphone system of claim 1, wherein the acoustic pressure received from the first direction causes a mechanical deflection of the first diaphragm and a mechanical deflection of the second diaphragm, wherein the mechanical deflection of the second diaphragm is substantially the same as the mechanical deflection of the first diaphragm.

4. The microphone system of claim 3, wherein the mechanical deflection of the first diaphragm produces an increase in the positively-biased output and wherein the mechanical deflection of the second diaphragm produces a decrease in the negatively-biased output, wherein a magnitude of the increase in the positively-biased output is substantially the same as a magnitude of the decrease in the negatively-biased output.

5. The microphone system of claim 4, wherein non-acoustic interference applied to the first diaphragm causes an increase in the positively-biased output and the non-acoustic interference applied to the second diaphragm causes an increase in the negatively-biased output, wherein a magnitude and polarity of the increase in the positively-biased output due to the non-acoustic interference is substantially the same as a magnitude and polarity of the increase in the negatively-biased output due to the non-acoustic interference.

6. The microphone system of claim 5, wherein the differential amplifier is configured to cancel the non-acoustic interference from the differential signal by combining the positively-biased output and the negatively-biased output such that a magnitude and polarity of the differential signal is based on differences between the positively-biased output and the negatively-biased output caused by mechanical deflection of the first diaphragm and the second diaphragm.

7. The microphone system of claim 5, wherein the non-acoustic interference includes at least one of light interference and electromagnetic interference.

8. The microphone system of claim 1, further comprising a CMOS chip, wherein the first diaphragm and the second diaphragm include MEMS devices formed in the CMOS chip.

9. The microphone system of claim 8, wherein the microphone system is configured to direct acoustic pressures towards a first side of the CMOS chip such that mechanical deflection of the first diaphragm due to the acoustic pressures is substantially the same as mechanical deflection of the second diaphragm due to the acoustic pressures.

10. The microphone system of claim 1, further comprising a high-impedance device coupled between a positive bias voltage source and a first terminal of the first diaphragm,
    wherein the first terminal of the first diaphragm is coupled to an input of the differential amplifier,
    wherein a second terminal of the first diaphragm is coupled to ground, and
    wherein mechanical deflections of the first diaphragm cause changes in capacitance between the first terminal of the first diaphragm and the second terminal of the first diaphragm.

11. The microphone system of claim 10, further comprising a second high-impedance device coupled between a negative bias voltage source and a first terminal of the second diaphragm,
    wherein the first terminal of the second diaphragm is coupled to a second input of the differential amplifier,
    wherein a second terminal of the second diaphragm is coupled to ground, and
    wherein mechanical deflections of the second diaphragm cause changes in capacitance between the first terminal of the second diaphragm and the second terminal of the second diaphragm.

12. The microphone system of claim 1, further comprising a first node coupled to a first terminal of the first diaphragm,
    wherein a positive bias voltage source is coupled to the first node through a first high-impedance device, and
    wherein the first node is coupled to ground through a first capacitor.

13. The microphone system of claim 12, wherein a second terminal of the first diaphragm is coupled to a reference voltage source through a second high impedance device, and wherein a first input of the differential amplifier is coupled to the second terminal of the first diaphragm.

14. The microphone system of claim 13, further comprising a second node coupled to a first terminal of the second diaphragm,
    wherein a negative bias voltage source is coupled to the second node through a third high impedance device,
    wherein the second node is coupled to ground through a second capacitor,
    wherein a second terminal of the second diaphragm is coupled to the reference voltage source through a fourth high impedance device, and
    wherein a second input of the differential amplifier is coupled to the second terminal of the second diaphragm.

15. A method of cancelling interference in a microphone system, the method comprising:
- applying a positive bias voltage to a first microphone diaphragm, the first microphone diaphragm being positioned adjacent to a shared back-volume;
- applying a negative bias voltage to a second microphone diaphragm, the second microphone diaphragm being arranged coplanar with the first microphone diaphragm and adjacent to the shared back-volume, the second microphone diaphragm being configured to exhibit substantially the same mechanical deflection as the first microphone diaphragm in response to acoustic pressures received by the microphone system; and
- producing a differential output signal by combining a positively-biased output signal from the first microphone diaphragm and a negatively-biased output signal from the second microphone diaphragm, wherein the combining cancels common-mode interference exhibited in both the positively-biased output signal from the first microphone diaphragm and the negatively-biased output signal from the second microphone diaphragm.

16. A microphone system including:
- a first microphone diaphragm positioned to receive acoustic pressure from a first direction through a fixed acoustic port, wherein a positive bias voltage is applied to the first diaphragm;
- a second microphone diaphragm coplanar with the first microphone diaphragm and positioned to receive acoustic pressure from the first direction through the fixed acoustic port at substantially the same amplitude as the acoustic pressure received by the first microphone diaphragm, wherein a negative bias voltage is applied to the second diaphragm;
- a shared back-volume adjacent to both the first microphone diaphragm and the second microphone diaphragm opposite the fixed acoustic port; and
- a differential amplifier configured to
  - receive a positively-biased output signal from the first microphone diaphragm and a negatively-biased output signal from the second microphone diaphragm, and
  - produce a differential output signal by combining the positively-biased output signal and the negatively-biased output signal,
- wherein the acoustic pressure received from the first direction causes mechanical deflections of the first diaphragm and substantially identical mechanical deflection of the second diaphragm,
- wherein the mechanical deflections of the first diaphragm produce the positively-biased output signal, the positively-biased output signal having a first magnitude and a first polarity,
- wherein the mechanical deflections of the second diaphragm produce the negatively-biased output signal, the negatively-biased output signal having a second magnitude and a second polarity, the second magnitude being substantially the same as the first magnitude and the second polarity being opposite the first polarity,
- wherein a non-acoustic interference alters the positively-biased output signal by a first magnitude and a first polarity and alters the negatively-biased output signal by a second magnitude and a second polarity, the first magnitude being substantially the same as the second magnitude and the first polarity being the same as the second polarity, and
- wherein the combining of the positively-biased output signal and the negatively-biased output signal by the differential amplifier cancels the non-acoustic interference from the differential output signal.

* * * * *